(12) United States Patent
Fujita et al.

(10) Patent No.: US 9,197,159 B2
(45) Date of Patent: Nov. 24, 2015

(54) MIXER

(71) Applicants: Sumitomo Electric Industries, Ltd., Osaka-shi (JP); Sumitomo Electric Device Innovations, Inc., Yokohama-shi (JP)

(72) Inventors: Seiji Fujita, Yokohama (JP); Tsuneo Tokumitsu, Yokohama (JP)

(73) Assignees: Sumitomo Electric Industries, Ltd., Osaka-shi (JP); Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 14/608,421

(22) Filed: Jan. 29, 2015

(65) Prior Publication Data

US 2015/0137870 A1     May 21, 2015

Related U.S. Application Data

(63) Continuation of application No. 14/099,148, filed on Dec. 6, 2013, now Pat. No. 8,975,946.

(30) Foreign Application Priority Data

Dec. 6, 2012 (JP) ................................. 2012-267624

(51) Int. Cl.
    *G06F 7/44*     (2006.01)
    *H04B 1/00*     (2006.01)
    *H03D 7/14*     (2006.01)
    *H04L 27/38*     (2006.01)

(52) U.S. Cl.
    CPC ........... *H03D 7/1483* (2013.01); *H03D 7/1441* (2013.01); *H03D 7/1458* (2013.01); *H03D 7/1466* (2013.01); *H04L 27/38* (2013.01)

(58) Field of Classification Search
    CPC ........................... H03D 7/1483; H03D 7/1441
    USPC ............................ 327/355–361; 455/323, 326
    See application file for complete search history.

(56) References Cited

U.S. PATENT DOCUMENTS

| | | |
|---|---|---|
| 4,193,036 A | 3/1980 | Cerny, Jr. et al. |
| 6,219,536 B1 * | 4/2001 | Kamase ....................... 455/333 |
| 6,745,019 B1 | 6/2004 | Thodesen |
| 6,871,059 B1 * | 3/2005 | Piro et al. ..................... 455/333 |
| 6,901,249 B1 | 5/2005 | Kobayashi |

(Continued)

FOREIGN PATENT DOCUMENTS

JP     2007-251989     9/2007

*Primary Examiner* — Dinh Le
(74) *Attorney, Agent, or Firm* — Venable LLP; Michael A. Sartori; F. Brock Riggs

(57) ABSTRACT

A mixer includes a first node to which an intermediate frequency (IF) signal is input; first and second transistors that respectively have control terminals supplied with local signals having mutually opposite phases and output terminals connected to the first node; a first filter that is connected between the output terminal of the second transistor and the first node and suppresses passage of the IF signal; a second node to which the IF signal is input; third and fourth transistors that respectively have control terminals supplied with local signals having mutually opposite phases and output terminals connected to the second node; a second filter that is connected between the output terminal of the fourth transistor and the second node and suppresses passage of the IF signal; and a combiner combining a signal output from the first node and a signal output from the second node.

4 Claims, 11 Drawing Sheets

(56) References Cited

U.S. PATENT DOCUMENTS

| | | | |
|---|---|---|---|
| 7,197,293 B2 * | 3/2007 | Vice | 455/326 |
| 7,580,693 B2 * | 8/2009 | Rohde et al. | 455/326 |
| 7,616,045 B2 * | 11/2009 | Vice | 327/359 |
| 8,249,541 B2 * | 8/2012 | Bao et al. | 455/330 |
| 8,975,946 B2 * | 3/2015 | Fujita et al. | 327/355 |

* cited by examiner

| $\omega_{IF}$ | $\omega_{LO} - \omega_{IF}$ | $\omega_{LO}$ | $\omega_{LO} + \omega_{IF}$ |
|---|---|---|---|
| IF | RF | LO | Im |

FREQUENCY

MIXER

CROSS-REFERENCE TO RELATED APPLICATION

This application is a Continuation of U.S. patent application Ser. No. 14/099,148, filed Dec. 6, 2013, which claims the benefit of Japanese Patent Application No. 2012-267624, filed on Dec. 6, 2012, all of which are incorporated by reference in their entirety.

BACKGROUND (i) Technical Field

The present invention relates to mixers.

(ii) Related Art

Recently, mobile communication devices such as cellular phones have been utilized. In radio communications, an intermediate frequency (IF) signal and a local (LO) signal are mixed with each other to generate a radio frequency (RF) signal. Japanese Patent Application Publication No. 2007-251989 discloses an art of mixing two signals to eliminate unwanted frequency components.

SUMMARY OF INVENTION

According to an aspect of the present invention, there is provided a mixer including: a first node to which an intermediate frequency (IF) signal is input; first and second transistors that respectively have control terminals supplied with local signals having mutually opposite phases and output terminals connected to the first node; a first filter that is connected between the output terminal of the second transistor and the first node and suppresses passage of the IF signal; a second node to which the IF signal is input; third and fourth transistors that respectively have control terminals supplied with local signals having mutually opposite phases and output terminals connected to the second node; a second filter that is connected between the output terminal of the fourth transistor and the second node and suppresses passage of the IF signal; and a combiner combining a signal output from the first node and a signal output from the second node.

According to another aspect of the present invention, there is provided a mixer including: a node to which an intermediate frequency (IF) signal is input; first and second transistors that respectively have control terminals supplied with local signals having mutually opposite phases and output terminals connected to the node; and a filter that is connected between the output terminal of the second transistor and the node and suppresses passage of the IF signal.

DETAILED DESCRIPTION

Exemplary embodiments of the present invention are now described.

First Embodiment

Figure 1:
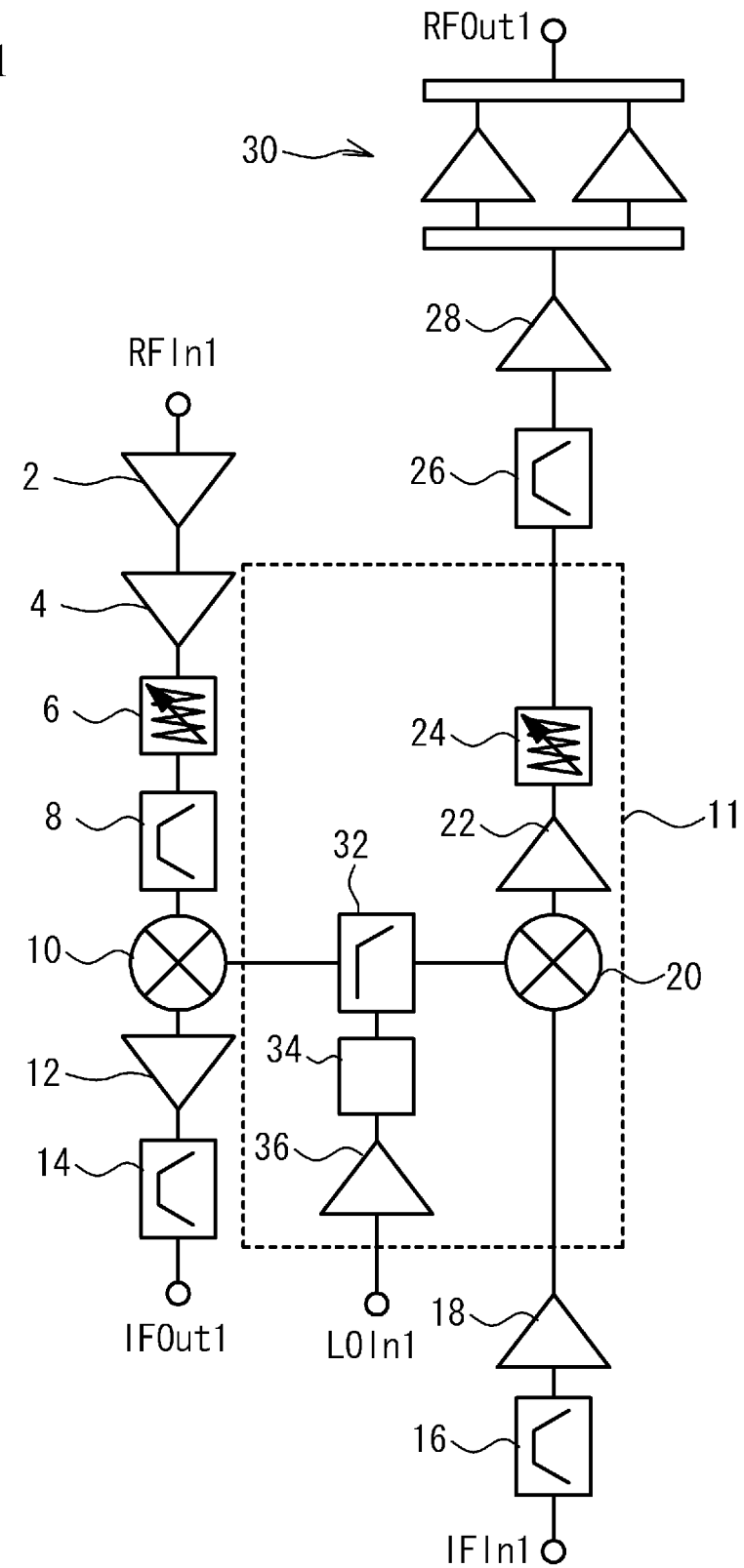
FIG. 1 is a circuit diagram of a communication system using a mixer in accordance with a first embodiment.

FIG. 1 is a circuit diagram of a communication system using a mixer 20 in accordance with a first embodiment. Referring to FIG. 1, between an input terminal RFIn1 and an output terminal IFOut1, connected in series are a low noise amplifier (LNA) 2, an amplifier 4, a variable attenuator 6, a bandpass filter (BPF) 8, a mixer 10, an amplifier 12 and a BPF 14 in this order from the input side. Between an input terminal IFIn1 and an output terminal RFOut1, connected in series are a BPF 16, an amplifier 18, a mixer 20, an amplifier 22, an attenuator 24, a BPF 26, an amplifier 28 and a power amplifier 30 in this order from the input side. A low pass filter (LPF) 32 is connected between the mixers 10 and 20. A frequency multiplier 34 and an amplifier 36 are connected in series between the LPF 32 and an input terminal LOIn1 in this order from the LPF 32 side.

A received signal is input to the input terminal RFIn1, and a LO signal is input to the input terminal LOIn1, and an IF signal is input to the input terminal IFIn1. The LO signal is output from a local oscillator (not illustrated). The mixer 10 mixes the received signal with the LO signal for down-conversion of the received signal. The received signal is output via the output terminal IFOut1. The mixer 20 mixes the IF signal with the LO signal for up-conversion of the IF signal, and thus generates a transmitted signal. The transmitted signal thus generated is output via the output terminal RFOut1. The mixer 20, the amplifier 22, the attenuator 24, the LPF 32, the frequency multiplier 34 and the amplifier 36 form an RF integrated circuit (RFIC) 11 including an up-converter (mixer 20).

Figure 2A:
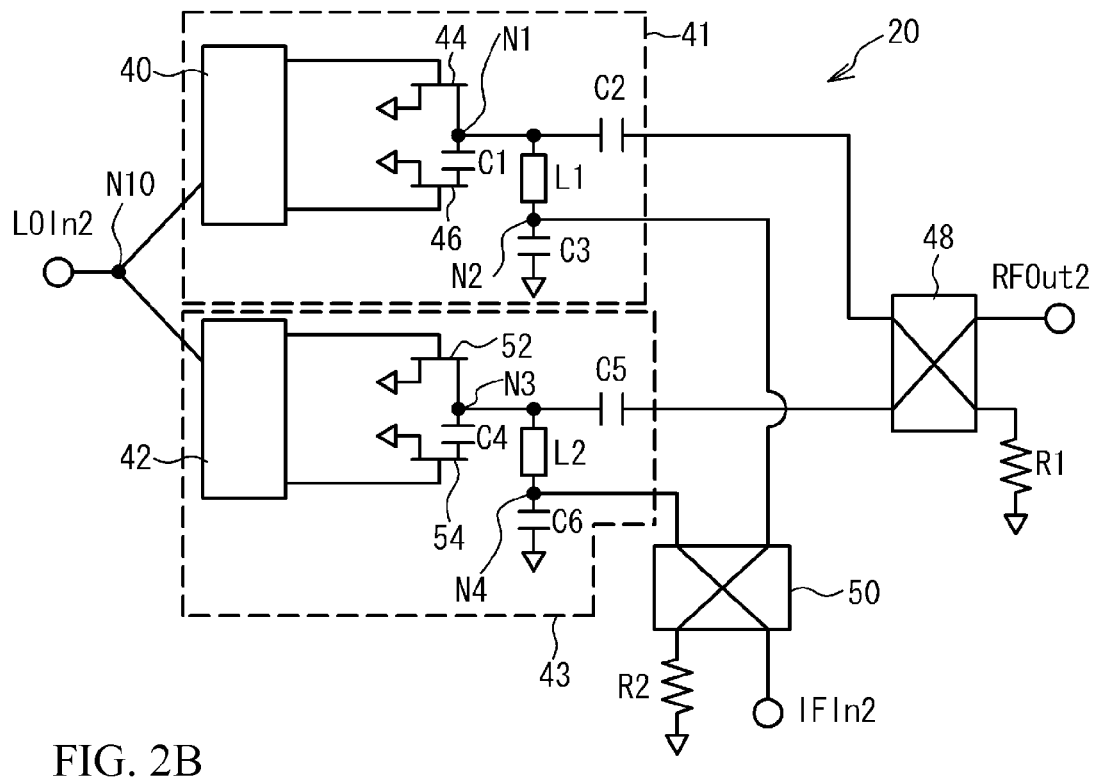
FIG. 2A is a circuit diagram of an exemplary mixer.

FIG. 2A is a circuit diagram of an exemplary configuration of the mixer 20. An input terminal LOIn2 in FIG. 2A is supplied with the LO signal from the input terminal LOIn1 in FIG. 1. An input terminal IFIn2 is supplied with the IF signal from the input terminal IFIn1. An RF signal (transmitted signal) is output from an output terminal RFOut2 to the output terminal RFOut1.

A circuit 41 includes a balun 40, a pair of field effect transistors (FETs) 44 and 46 (first and second transistors), capacitors C1~C3 and an inductor L1. The input terminal LOIn2 is electrically connected to the input terminals of baluns 40 and 42 (unbalanced terminals). One of the two output terminals of the balun 40 (balanced terminals) is electrically connected to a gate (control terminal) of FET 44, and the other is electrically connected to the gate of FET 46. The sources of FETs 44 and 46 are grounded. The drain (output terminal) of FET 44 and the drain of FET 46 are electrically interconnected. A capacitor C1 (first filter) is connected in series between the drains of FETs 44 and 46. One end of a capacitor C2 is electrically connected to a node N1 (first node) interposed between one end of the capacitor C1 and the drain of FET 44. The other end of the capacitor C2 is electrically connected to one of two input terminals of a 90° coupler 48. One end of the inductor L1 is electrically connected to a node at which the node N1 and the capacitor C2 are interconnected. The other end of the inductor L1 is electrically connected to one end of the capacitor C3, and the other end thereof is grounded. A node N2 between the inductor L1 and the capacitor C3 is electrically connected to one of two output terminals of a 90° coupler 50.

A circuit 43 includes the balun 42, a pair of FETs 52 and 54 (third and fourth transistors), capacitors C4~C6, and an inductor L2. The circuit 43 is connected in a manner similar to that of the circuit 41. A node N3 (second node) is defined as a node at which the drain of the FET 52 and one end of the capacitor C4 (second filter) are interconnected. The capacitor C5 is connected to the other input terminal of the 90° coupler 48. A node N4 between the inductor L2 and the capacitor C6 is connected to the other output terminal of the 90° coupler 50. One of the two output terminals of the 90° coupler 48 is connected to the output terminal RFOut2, and the other output terminal is grounded through a resistor R1. One of the two input terminals of the coupler 50 is connected to the input terminal IFIn2, and the other input terminal is grounded through a resistor R2. A circuit composed of the inductor L1 and the capacitor C3, and a circuit composed of the inductor L2 and the capacitor C6 function as filters (third and fourth filters) that introduce the generated RF signals to the output terminal RFOut2 and suppress passage of the IF signals. The input terminal LOIn2 branches into two lines at a node N10. The branch at the node N10 is a simple branch, and the impedance viewed from the LOIn2 side is equal to the impedances of the control terminals of the pair of FETs 44 and 46 and those of the control terminals of the pair of FETs 52 and 54. Thus, the LO signal does not have any considerable difficulty in inputting.

The input and output signals of the mixer 20 are now described. The LO signal is input to the baluns 40 and 42, and the IF signal is input to the nodes N2 and N4. The baluns 40 and 42 output the respective LO signals that are 180° out of phase. The LO signals input to FETs 46 and 54 are 180° out of phase with the LO signals input to FETs 44 and 52. The 90° coupler 50 outputs the IF signals that are 90° out of phase with each other. The IF signal input to the node N4 is 90° out of phase with the IF signal input to the node N2. The 90° coupler 48 functions as a combiner, which makes a 90° phase difference between the output signal of the node N1 and that of the node N3 and combines the output signals with each other. More specifically, the 90° coupler 48 delays the phase of the signal from the node N3 by 90°, and combines the delayed signal with the output signal of the node N1. The output of the 90° coupler 48 is an RF signal. The term "combine" means adding the signals together.

Figure 2B:
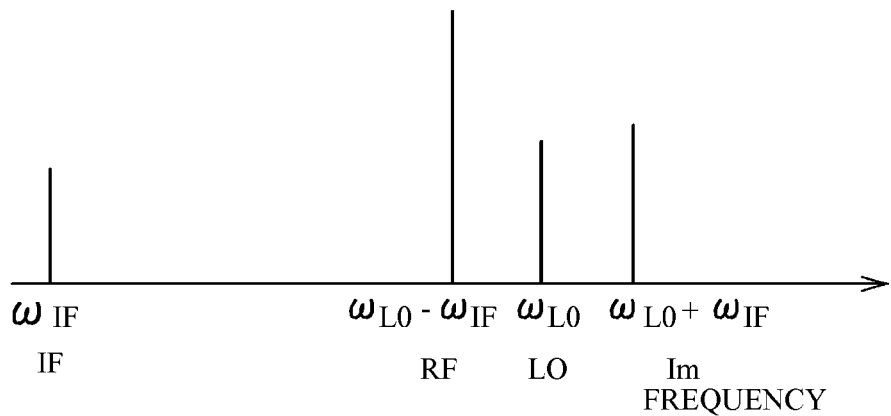
FIG. 2B is a schematic diagram of signal outputs of the mixer.

FIG. 2B schematically depicts the signals output from the mixer 20. The horizontal axis denotes the frequency. Referring to FIG. 2B, the frequency $\omega_{LO}$ of the LO signal is 15 GHz, for example. The frequency $\omega_{IF}$ of the IF signal is 2 GHz, for example, which is much lower than $\omega_{LO}$. The FETs 44 and 46 mix the IF signal and the LO signal with each other, and generate the RF signal and an image (Im) signal. In the example of FIG. 2B, it is assumed that the RF signal has a frequency obtained by subtracting the frequency $\omega_{IF}$ of the IF signal from the frequency $\omega_{LO}$ of the LO signal and that the Im signal has a frequency equal to the sum of the frequency $\omega_{LO}$ of the LO signal and the frequency $\omega_{IF}$ of the IF signal. For example, the frequency $\omega RF$ of the RF signal is equal to $\omega_{LO}-\omega_{IF}$ and is 13 GHz. Similarly, the frequency $\omega_{Im}$ of the Im signal is equal to $\omega_{LO}+\omega_{IF}$ and is 17 GHz. As will be described later, in the first embodiment, the RF signal is output and the Im signal is suppressed, as illustrated in FIG. 2B.

Figure 2C:
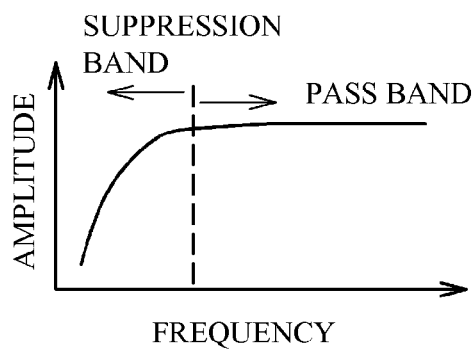
FIG. 2C is a schematic diagram of a frequency characteristic of a capacitor.

The frequency characteristics of the capacitors C1 and C4 illustrated in FIG. 2A are now described. FIG. 2C is a schematic diagram of exemplary frequency characteristics of the capacitors C1 and C4. The horizontal axis denotes the frequency and the vertical axis denotes the amplitude.

As illustrated in FIG. 2C, the capacitors C1 and C4 suppress passage of the signals on the low-frequency side, and allow passage of the signals on the high-frequency side. The IF signal is included in the suppression band, and the LO signal is included in the pass band. The capacitors C1 and C4 suppress the IF signal of the frequency lower than that of the LO signal. Thus, the IF signal that flows through the FET 46 is suppressed. Thus, the mixing of the LO signal and the IF signal by FET 46 is suppressed. Similarly, the IF signal that flows through the FET 54 is suppressed, and the mixing of the LO signal and the IF signal by the FET 54 is suppressed. The capacitors C1 and C4 allow passage of the LO signal.

Table 1 describes exemplary signals in the mixer 20.

TABLE 1

| Position | Signal |
| --- | --- |
| FET 44 | $LO(\omega_{LO})$, $IF(\omega_{IF})$, $RF(\omega_{LO} - \omega_{IF})$, $Im(\omega_{LO} + \omega_{IF})$ |
| FET 46 | $LO(\omega_{LO} + \pi)$ |
| N1 | $IF(\omega_{IF})$, $RF(\omega_{LO} - \omega_{IF})$, $Im(\omega_{LO} + \omega_{IF})$ |
| FET 52 | $LO(\omega_{LO})$, $IF(\omega_{IF} + \pi/2)$, $RF(\omega_{LO} - \omega_{IF} - \pi/2)$, $Im(\omega_{LO} + \omega_{IF} + \pi/2)$ |
| FET 54 | $LO(\omega_{LO} + \pi)$ |
| N3 | $IF(\omega_{IF} + \pi/2)$, $RF(\omega_{LO} - \omega_{IF} - \pi/2)$, $Im(\omega_{LO} + \omega_{IF} + \pi/2)$ |
| RFOut2 | $RF(\omega_{LO} - \omega_{IF})$ |

In Table 1, the signals related to the transistors are those at the drains thereof. The parameters in parentheses express the phases at the same time. For example, $LO(\omega_{LO})$ denotes the LO signal having a phase of $\omega_{LO}$, and $LO(\omega_{LO}+\pi)$ denotes the LO signal having a phase of $\omega_{LO}+\pi$.

The signals $LO(\omega_{LO})$, $IF(\omega_{IF})$, $RF(\omega_{LO}-\omega_{IF})$, $Im(\omega_{LO}+\omega_{IF})$ are output from the drain of FET 44. The signal LO $(\omega_{LO}+\pi)$ is output from the drain of FET 46. As described above, since the capacitor C1 suppress passage of the IF signal, the RF signal and Im signal are not output. Since the balun 40 delays the phase of the LO signal by 180° ($\pi$), the LO signal input to the control terminal of FET 46 is 180° out of phase with the LO signal input to the control terminal of FET 44. Similarly, the LO signal that leaks to the drain terminal from the control terminal of FET 46 is 180° out of phase with the LO signal that leaks to the drain terminal of FET 44 from the control terminal thereof. The output signals from FETs 44 and 46 are combined at the node N1. The LO signals that have opposite phases (180° out of phase with each other) are mutually canceled at the common drain terminals of FETs 44 and 46 and parts of the RF signal, Im signal and IF signal are output.

From the drain of FET 52, outputs are the LO signal $LO(\omega_{LO})$, $IF(\omega_{IF}+\pi/2)$, $RF(\omega_{LO}-\omega_{IF}-\pi/2)$ and $Im(\omega_{LO}+\omega_{IF}+\pi/2)$. The LO signal $LO(\omega_{LO}+\pi)$ is output from the drain of FET 54. At the node N3, the LO signals are mutually canceled and parts of the RF signal, the Im signal and the IF signal are output. The 90° coupler 50 delays the phase of the IF signal by $\pi/2$. Thus, the phases of the IF signal, the RF signal and the Im signal are $\pi/2$ out of phase with the corresponding signals at the node N1.

The 90° coupler 48 delays the phases of the signals output from the node N3 by $\pi/2$. At the node N3, the phase of the IF signal has a phase of $\omega_{IF}+\pi$, the RF signal has a phase of $\omega_{LO}-\omega_{IF}$, and the Im signal has a phase of $\omega_{LO}+\omega_{IF}+\pi$. Further, the 90° coupler 48 combines the output signals of the node N1 and the output signals of the node N3. The Im signal $Im(\omega_{LO}+\omega_{IF})$ and the Im signal $Im(\omega_{LO}+\omega_{IF}+\pi)$ are 180° out of phase with each other, and are mutually canceled. In contrast, the two RF signals are in phase, and are added. Thus, as illustrated in FIG. 2B, the passage of the Im signal is suppressed and the RF signal is output from the output terminal RFOut2.

According to the first embodiment, the RF signals and the Im signals are generated at FETs 44 and 52. The LO signals that are 180° out of phase with each other are mutually canceled at the nodes N1 and N3. The 90° coupler 50 makes a phase difference of $\pi/2$ between the two IF signals. The 90° coupler 48 makes a 90° phase difference between the two output signals and combines these signals with each other. Thus, the leakage of the LO signal is suppressed, and the passage of the Im signal is suppressed, while only the RF signal is output.

The frequency characteristic of the mixer 20 is simulated. In the simulation, calculated are the RF signal, the Im signal, the LO signal that leaks to the output terminal RFOut2 (LO leakage on the RF side), the IF signal (IF leakage on the RF side), and the LO signal that leaks to the input terminal IFIn2 (LO leakage on the IF side). The FETs 44, 46, 52 and 54 are HEMTs (High Electron Mobility Transistors) having electron supply layers of aluminum gallium arsenide (AlGaAs) and channel layers of indium gallium arsenide (InGaAs). The frequency $\omega_{IF}$ of the IF signal is 1 GHz, and the frequency $\omega_{LO}$ of the LO signal is 8~32 GHz.

Figure 3A:
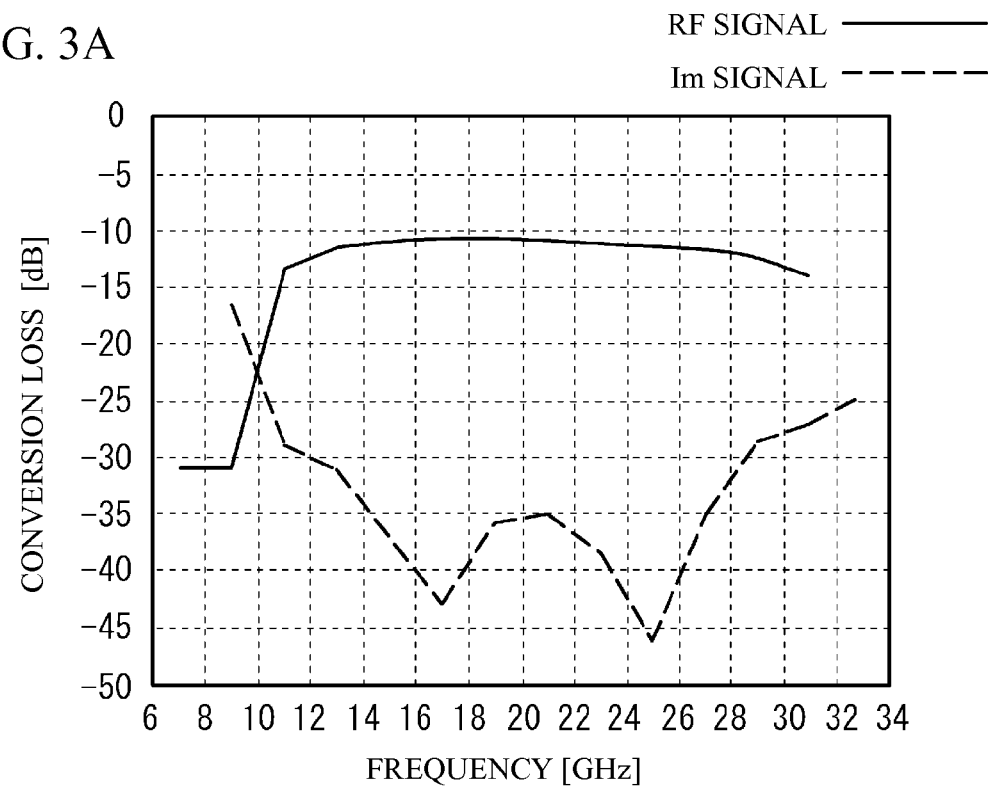
FIG. 3A is a graph that describes results of calculation of an RF signal an Im signal.

FIG. 3A is a graph that illustrates the results of calculation of the RF signal and the Im signal. The horizontal axis denotes the frequency and the vertical axis denotes the conversion loss. A solid line indicates the RF signal and a broken line indicates the Im signal. As illustrated in FIG. 3A, the conversion loss of the RF signal is approximately −10 dB. The conversion loss of the Im signal is approximately −35~−45 dB. The passage of the Im signal is greatly suppressed and is 25 dB smaller than the RF signal. This is because, as previously described with reference to Table 1, the Im signals that are 180° out of phase with each other are mutually canceled.

Figure 3B:
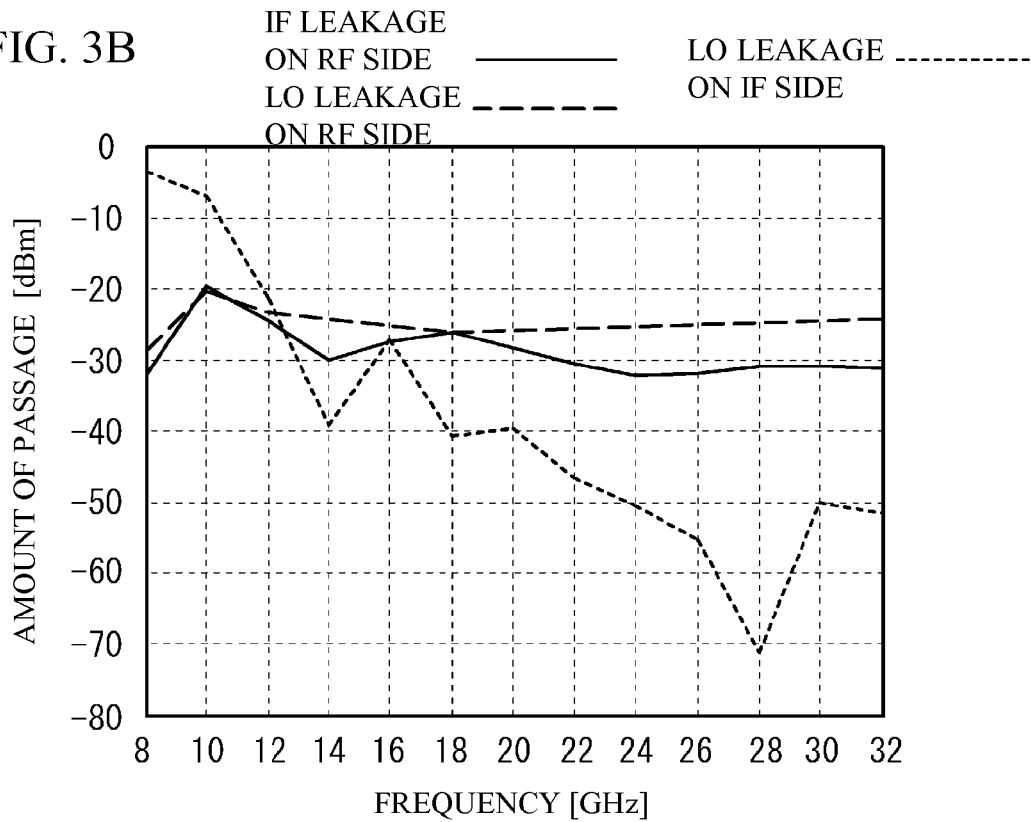
FIG. 3B is a graph that describes results of calculation of a LO leakage on an RF side, an IF leakage on the RF side, and a LO leakage on an IF side.

FIG. 3B are graphs that illustrate the results of calculation of the LO leakage on the RF side, the IF leakage on the RF side and the LO leakage on the IF side. The vertical axis denotes the amount of passage. As illustrated in FIG. 3B, the LO leakage on the RF side is approximately −2 dBm, the IF leakage on the RF side is approximately −30 dBm, and the LO leakage on the IF side is approximately −75~−30 dBm in a frequency range of 10~32 GHz when the input level of the LO signal is +15 dBm, and the input level of the IF signal is +0 dBm. It is seen from the above that the leakage of the LO signal is suppressed. This is because the LO signals that are 180° out of phase with each other are cancelled, as has been described with reference to Table 1.

Figure 4A:
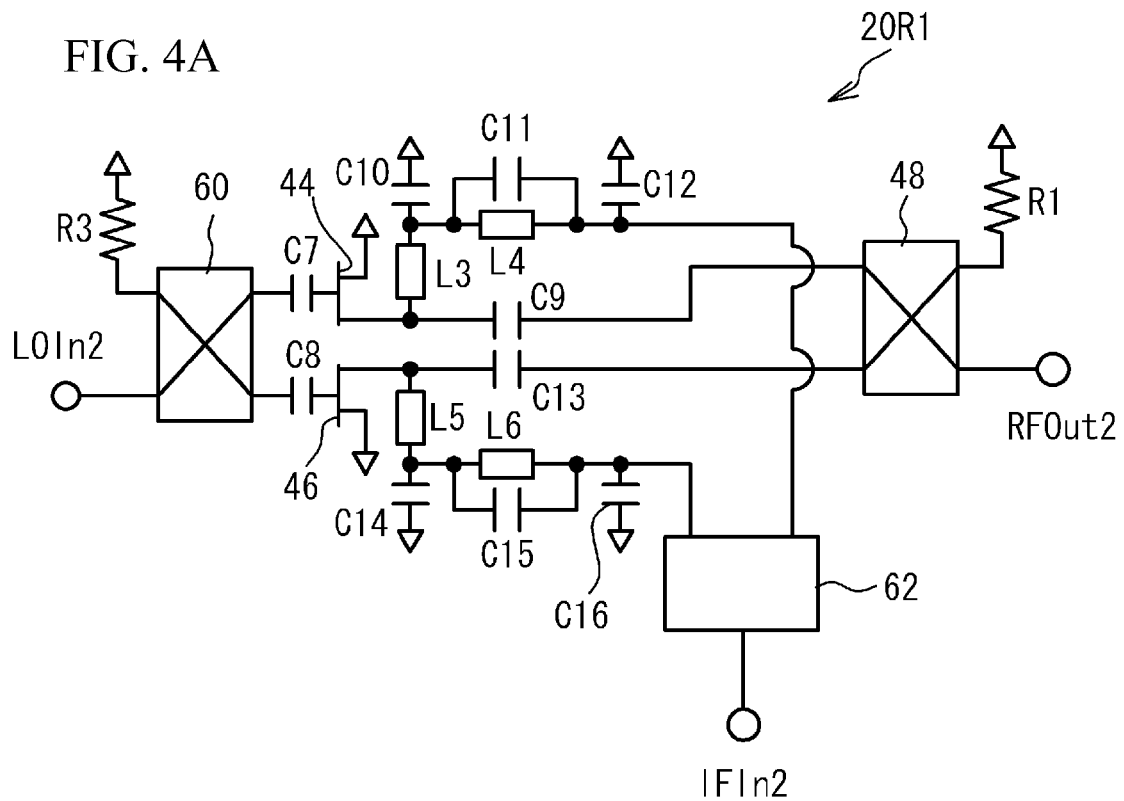
FIG. 4A is a circuit diagram of a mixer in accordance with a first comparative example.

Comparative examples are now described. A first comparative example uses a pair of transistors. FIG. 4A is a circuit diagram of a mixer 20R1 according to the first comparative example.

As illustrated in FIG. 4A, the input terminal LOIn2 is connected to one of two input terminals of a 90° coupler 60, and the other input terminal is grounded through a resistor R3. One of two output terminals of the 90° coupler 60 is connected to the gate of FET 44 through a capacitor C7, and the other output terminal is connected to the gate of FET 46 through a capacitor C8. The drain of FET 44 is connected to the 90° coupler 48 through a capacitor C9. One end of an inductor L3 is connected to the node between FET 46 and the capacitor C9, and the other end is grounded through a capacitor C10. The node between the inductor L3 and the capacitor C10 is connected to one of two output terminals of a balun 62 through an inductor L4. A capacitor C11 is connected in parallel with the inductor L4, and a capacitor C12 is connected to the node between the inductor L4 and the balun 62. Similarly, FET 46, capacitors C13~C16, inductors L5 and L6, the 90° coupler 48 and the balun 62 are connected. The capacitors C7 and C8 suppress passage of the DC components included in the LO signals. The capacitors C10~C12 and the inductors L3 and L4 function as a filter that suppresses leakage of the LO signal to the input terminal IFIn2. Similarly, the capacitors C14~C16 and the inductors L5 and L6 function as a filter that suppresses leakage of the LO signal to the input terminal IFIn2.

Figure 4B:
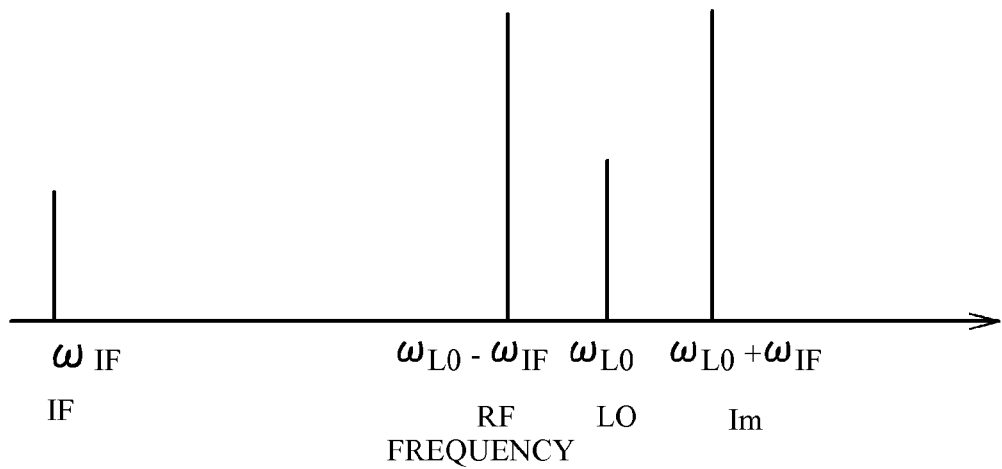
FIG. 4B is a schematic diagram of signal outputs of the mixer.

FIG. 4B schematically illustrates signal outputs of the mixer 20R1. Table 2 describes exemplary signals in the mixer 20R1.

TABLE 2

| Position | Signal |
|---|---|
| FET 44 | $LO(\omega_{LO}+\pi/2)$, $IF(\omega_{IF}+\pi)$, $RF(\omega_{LO}-\omega_{IF}-\pi/2)$, $Im(\omega_{LO}+\omega_{IF}+3\pi/2)$ |
| FET 46 | $LO(\omega_{LO})$, $IF(\omega_{IF})$, $RF(\omega_{LO}-\omega_{IF})$, $Im(\omega_{LO}+\omega_{IF})$ |
| RFOut2 | $IF(\omega_{IF})$, $IF(\omega_{IF}+3\pi/2)$, $RF(\omega_{LO}-\omega_{IF})$, $Im(\omega_{LO}+\omega_{IF})$ |

The LO signal is input to one of the two inputs of the 90° coupler 60. The 90° coupler 60 shifts the phase of the LO signal by 90°, and then applies the LO signal to the gate of FET 44. Further, the 90° coupler 60 outputs the LO signal to the gate of FET 46 without any phase shift. The balun 62 applies the IF signal that has been phase-shifted by 90° to the FET 44, and applies the IF signal to FET 46 without any phase shift. As shown in Table 2, FET 44 outputs the LO signal $LO(\omega_{LO}+\pi/2)$, the IF signal $IF(\omega_{IF}+\pi)$, the RF signal $RF(\omega_{LO}-\omega_{IF}-\pi/2)$, and the Im signal $Im(\omega_{LO}+\omega_{IF}+3\pi/2)$. Further, FET 46 outputs the LO signal $LO(\omega_{LO})$, the IF signal $IF(\omega_{IF})$, the RF signal $RF(\omega_{LO}-\omega_{IF})$, and the Im signal $Im(\omega_{LO}+\omega_{IF})$. The 90° coupler 48 shifts the phase of the output signal of FET 44 by 90°, and combines it with the output signal of the FET 46. The two LO signals are 180° out of phase with each other, and are mutually canceled. The RF signal and the Im signal are in phase with each other, and are added. Thus, as illustrated in FIG. 4B, both the RF signal and the Im signal are output without being suppressed.

Figure 5A:
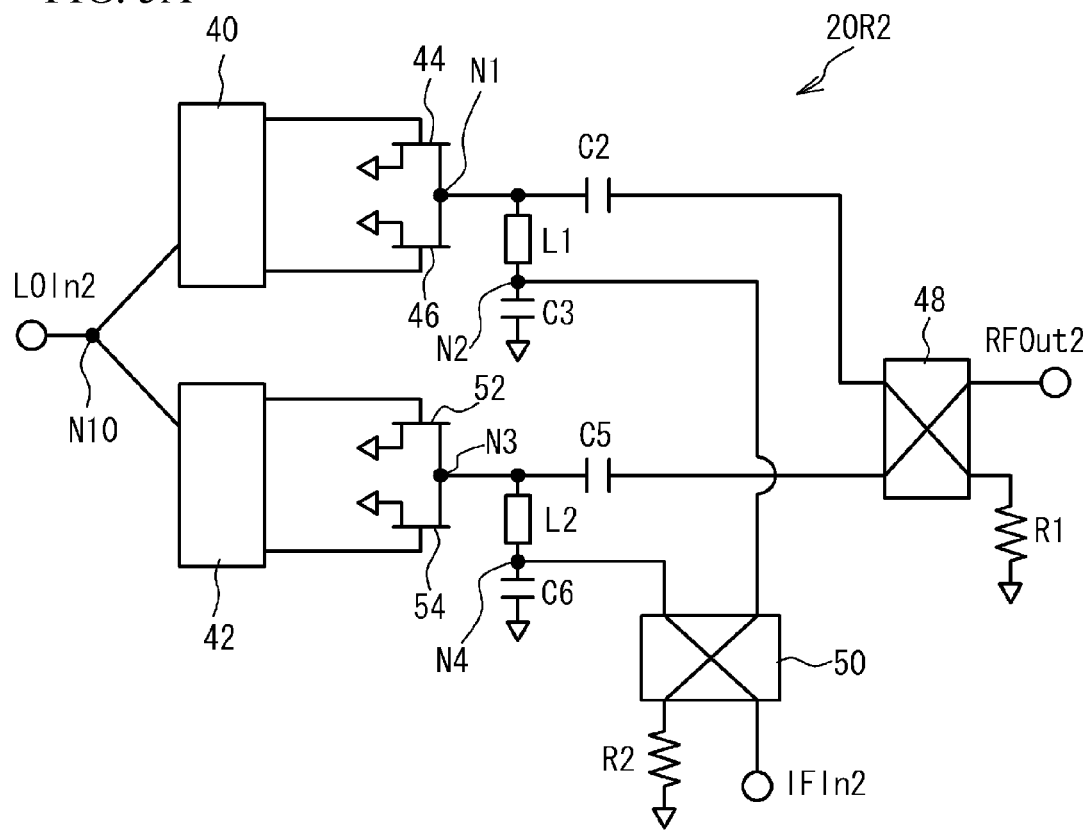
FIG. 5A is a circuit diagram of a mixer in accordance with a second comparative example.

A second comparative example uses two pairs of transistors. FIG. 5A is a circuit diagram of a mixer 20R2 in accordance with the second comparative example. The mixer 20R2 has a structure obtained by removing the capacitor C1 and C4 from the mixer 20.

Figure 5B:
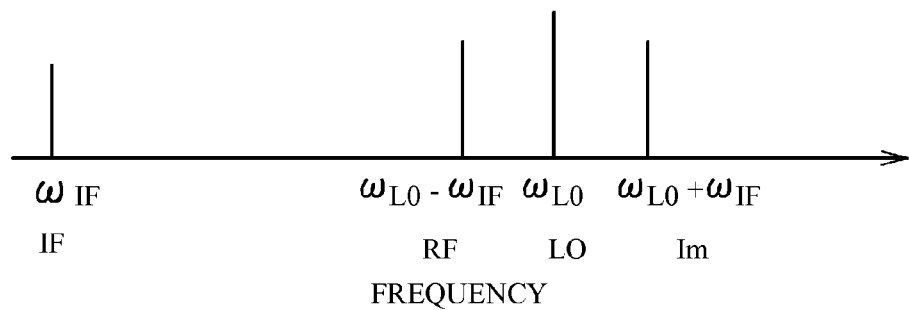
FIG. 5B is a schematic diagram of signal outputs of the mixer.

Table 3 describes exemplary signals in the mixer 20R2. FIG. 5B schematically illustrates signal outputs of the mixer 20R2.

TABLE 3

| Position | Signal |
| --- | --- |
| FET 44 | LO($\omega_{LO}$), IF($\omega_{IF}$), RF($\omega_{LO} - \omega_{IF}$), Im($\omega_{LO} + \omega_{IF}$) |
| FET 46 | LO($\omega_{LO} + \pi$), IF($\omega_{IF}$), RF($\omega_{LO} - \omega_{IF} + \pi$), Im($\omega_{LO} + \omega_{IF} + \pi$) |
| N1 | IF($\omega_{IF}$) |
| FET 52 | LO($\omega_{LO}$), IF($\omega_{IF} + \pi/2$), RF($\omega_{LO} - \omega_{IF} - \pi/2$), Im($\omega_{LO} + \omega_{IF} + \pi/2$) |
| FET 54 | LO($\omega_{LO} + \pi$), IF($\omega_{IF} + \pi/2$), RF($\omega_{LO} - \omega_{IF} + \pi/2$), Im($\omega_{LO} + \omega_{IF} + 3\pi/2$) |
| N3 | IF($\omega_{IF} + \pi/2$) |
| RFOut2 | None |

As described in Table 3, the FET 44 outputs the LO signal LO($\omega_{LO}$), the IF signal IF($\omega_{IF}$), the RF signal RF($\omega_{LO}-\omega_{IF}$), and the Im signal Im($\omega_{LO}+\omega_{IF}$). The FET 46 outputs the LO signal LO($\omega_{LO}+\pi$), the IF signal IF($\omega_{IF}$), the RF signal RF($\omega_{LO}-\omega_{IF}+\pi$), the Im signal Im($\omega_{LO}+\omega_{IF}+\pi$). The LO signals are 180° out of phase with each other, and are mutually canceled. The RF signals are 180° out of phase with each other, and are mutually canceled. The Im signals are 180° out of phase with each other, and are mutually canceled. The IF signal IF ($\omega_{IF}$) are output from the node N1. Similarly, out of the signals output from FETs 52 and 54, the LO signals, the RF signals and the Im signals are 180° out of phase and are mutually canceled. Thus, only the IF signal IF($\omega_{IF}+\pi/2$) are output. The passage of the IF signal is suppressed by the capacitors C2 and C5. Further, the IF signal is out of the band of the 90° coupler 48 and is not output. As illustrated in FIG. 5B, both the RF signal and the Im signal are suppressed. In contrast, according to the first embodiment, as illustrated in FIG. 2B, the passage of the Im signal is suppressed, while the RF signal is output.

Figure 6:
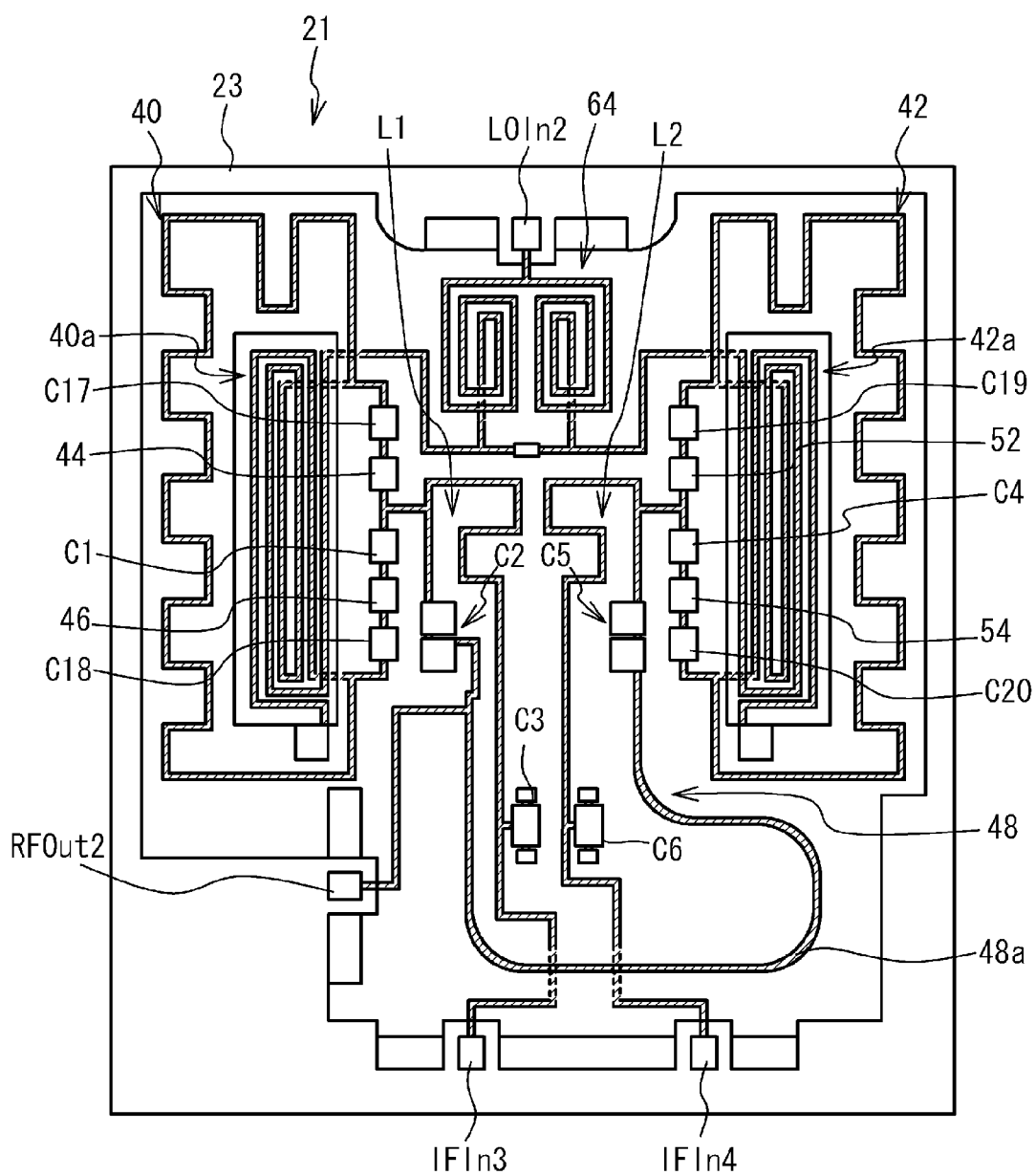
FIG. 6 is a plan view of a mixer chip.

A mixer chip 21 is now described. The mixer chip 21 is used to form the mixer 20. FIG. 6 is a plan view of an exemplary structure of the mixer chip 21. Interconnection lines with hatching are provided on a substrate 23.

As illustrated in FIG. 6, the LO signal input to the input terminal LOIn2 is distributed to the baluns 40 and 42 by a divider 64. The balun 40 includes a lange coupler 40a, and the balun 42 includes a lange coupler 42a. A capacitor C17 is connected between the balun 40 and FET 44, and a capacitor C18 is connected between the balun 40 and FET 46. A capacitor C19 is connected between the balun 42 and FET 52, and a capacitor C20 is connected between the balun 42 and FET 54. The capacitors C17~C20 suppress passage of the DC components of the LO signals. The 90° coupler 50 is not illustrated in FIG. 6 and is connected to the outside of the mixer chip 21. The IF signals having the phase difference made by the 90° coupler 50 are input the input terminals IFIn3 and IFIn4. An interconnection line 48a of the 90° coupler 48 delays the phase of the signal by 90°. The inductors L1 and L2 are formed by interconnection lines that extend in the substrate 23. For example, the structure may be varied so that the 90° coupler 48 is not included in the mixer chip 21 but may be externally connected thereto.

Second Embodiment

Figure 7:
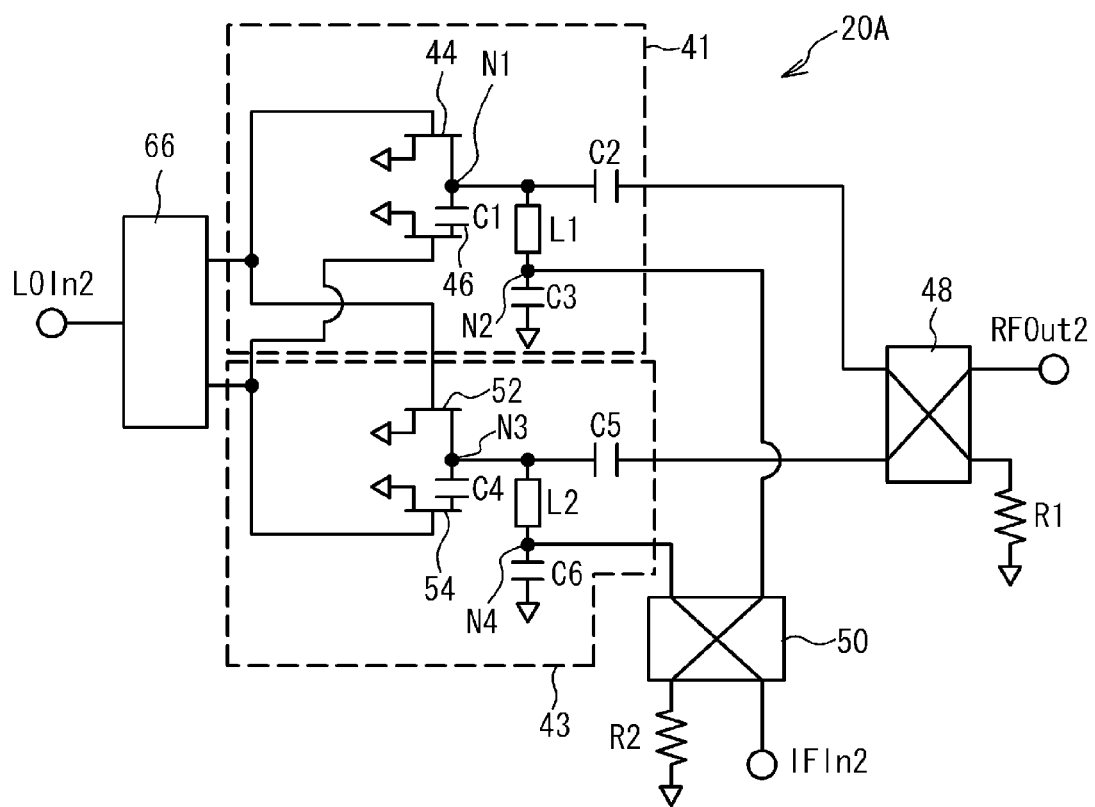
FIG. 7 is a circuit diagram of a mixer in accordance with a second embodiment.

A second embodiment 2 has an exemplary structure in which a changed number of baluns is used. FIG. 7 is a circuit diagram of a mixer 20A in accordance with the second embodiment.

Referring to FIG. 7, the input terminal LOIn2 is connected to a single input terminal of a single balun 66. One of two output terminals of the balun 66 is connected to the gates of FETs 44 and 52. The other output terminal of the balun 66 is connected to the gates of FETs 46 and 54. The remaining structures are the same as those of the mixer 20. As described in Table 1, the Im signals are canceled even in the second embodiment, and only the RF signal is output. The use of the single balun contributes to downsizing of the mixer 20A.

Third Embodiment

Figure 8:
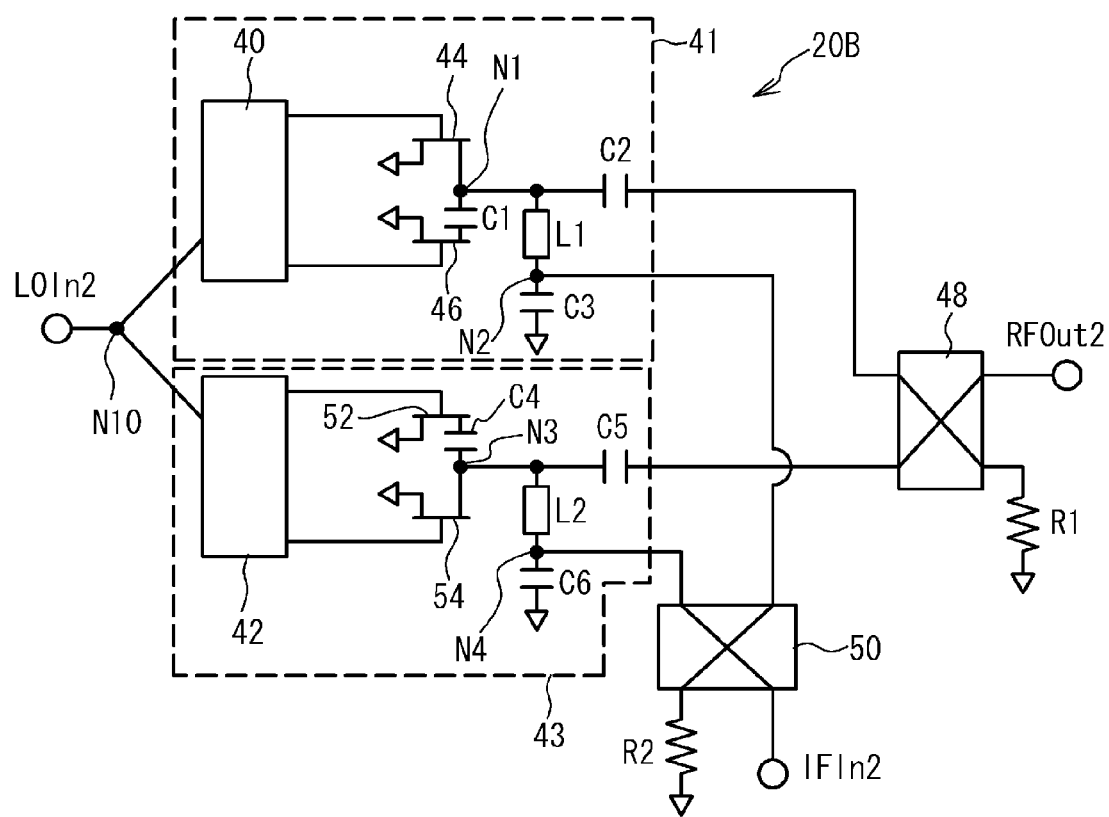
FIG. 8 is a circuit diagram of a mixer in accordance with a third embodiment.

A third embodiment has an exemplary structure in which the position of the capacitor C4 is changed. FIG. 8 is a circuit diagram of a mixer 20B in accordance with the third embodiment. As illustrated in FIG. 8, the capacitor C4 is connected between the drain of FET 52 (fourth transistor) and the node N3. The remaining structures of the third embodiment are the same as those of the mixer 20.

Table 4 describes exemplary signals in the mixer 20B. In the third embodiment, it is assumed that the frequency of the RF signal is the sum of the frequency of the LO signal and that of the IF signal, and the frequency of the Im signal is the result of subtracting the frequency of the Im signal from that of the LO signal.

TABLE 4

| Position | Signal |
| --- | --- |
| FET 44 | LO($\omega_{LO}$), IF($\omega_{IF}$), RF($\omega_{LO} + \omega_{IF}$), Im($\omega_{LO} - \omega_{IF}$) |
| FET 46 | LO($\omega_{LO} + \pi$) |
| N1 | IF($\omega_{IF}$), RF($\omega_{LO} + \omega_{IF}$), Im($\omega_{LO} - \omega_{IF}$) |
| FET 52 | LO($\omega_{LO}$) |
| FET 54 | LO($\omega_{LO} + \pi$), IF($\omega_{IF} + \pi/2$), RF($\omega_{LO} + \omega_{IF} + 3\pi/2$), Im($\omega_{LO} - \omega_{IF} + \pi/2$) |
| N3 | IF($\omega_{IF} + \pi/2$), RF($\omega_{LO} + \omega_{IF} + 3\pi/2$), Im($\omega_{LO} - \omega_{IF} + \pi/2$) |
| RFOut2 | RF($\omega_{LO} + \omega_{IF}$) |

As described in Table 4, the IF signal IF($\omega_{IF}$), the RF signal RF($\omega_{LO}+\omega_{IF}$), and the Im signal Im($\omega_{LO}-\omega_{IF}$) are output from the node N1. The LO signal LO($\omega_{LO}$) is output from the drain of FET 52. From the drain of FET 54, output are the LO signal LO ($\omega_{LO}+\pi$), the IF signal IF ($\omega_{IF}+\pi/2$), the RF signal RF($\omega_{LO}+\omega_{IF}+3\pi/2$), and the Im signal Im($\omega_{LO}-\omega_{IF}+\pi/2$). The 90° coupler 48 shifts the output signal of the node N3 by $\pi/2$. Thus, the RF signals at the nodes N1 and N3 are in phase with each other, and the Im signals at the nodes N1 and N3 are 180° out of phase with each other. The RF signal RF($\omega_{LO}+\omega_{IF}$ is output from the output terminal RFOut2.

As described above, the third embodiment is capable of suppressing passage of the Im signal and extracting the RF signal as in the case of the first and second embodiments. The positional change of the capacitor C4 makes it possible to set the frequency of the RF signal equal to $\omega_{LO}+\omega_{IF}$.

Fourth Embodiment

Figure 9A:
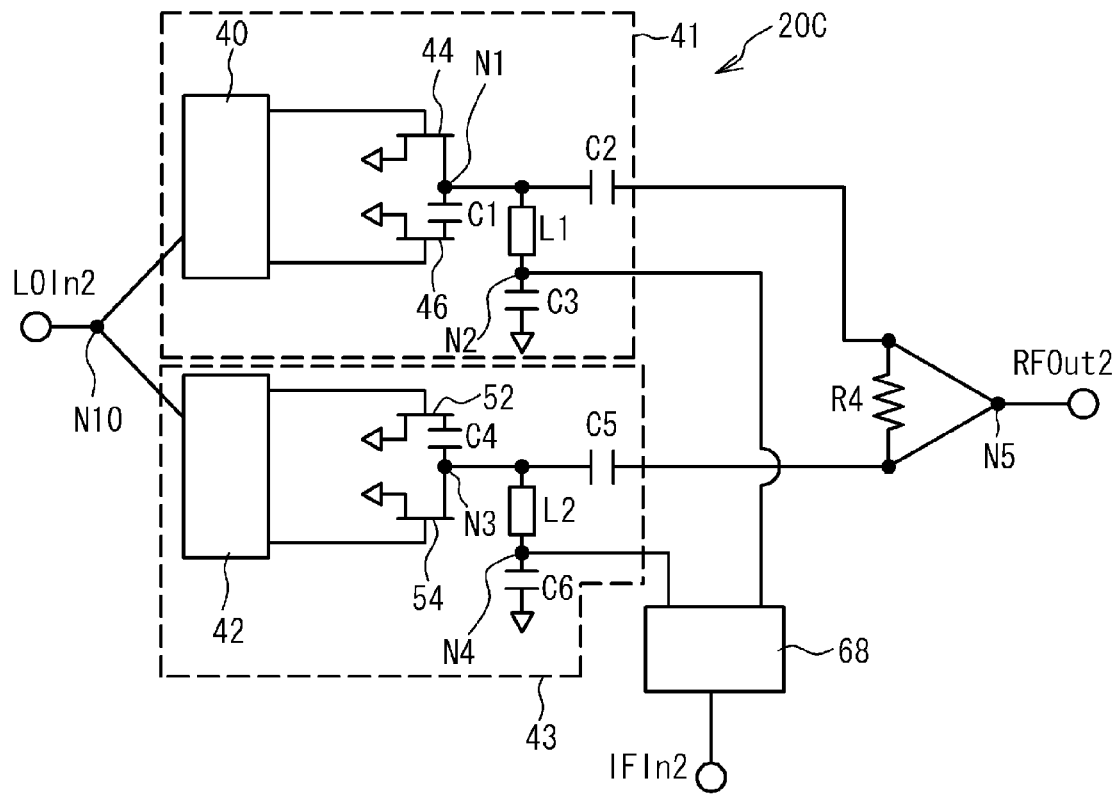
FIG. 9A is a circuit diagram of a mixer in accordance with a fourth embodiment.

A fourth embodiment has an exemplary structure in which both the RF signal and the Im signal are output. FIG. 9A is a circuit diagram of a mixer 20C in accordance with the fourth embodiment.

As illustrated in FIG. 9A, the IF signal is input to a balun 68. One of two output terminals of the balun 68 is connected to the node N2, and the other output terminal is connected to the node N4. The balun 68 shifts the phase of the IF signal by 180° and outputs the IF signals that are 180° out of phase with each other to the nodes N2 and N4. The output signal from the node N1 and that from the node N3 are combined with each other at a node N5, and a combined output is available at the output terminal RFOut2. An end of a resistor R4 is connected between the nodes N1 and N5, and the other end thereof is connected between the nodes N3 and N5. The node N5 and the resistor R4 form a combiner. The combiner is a Wilkinson coupler.

Figure 9B:
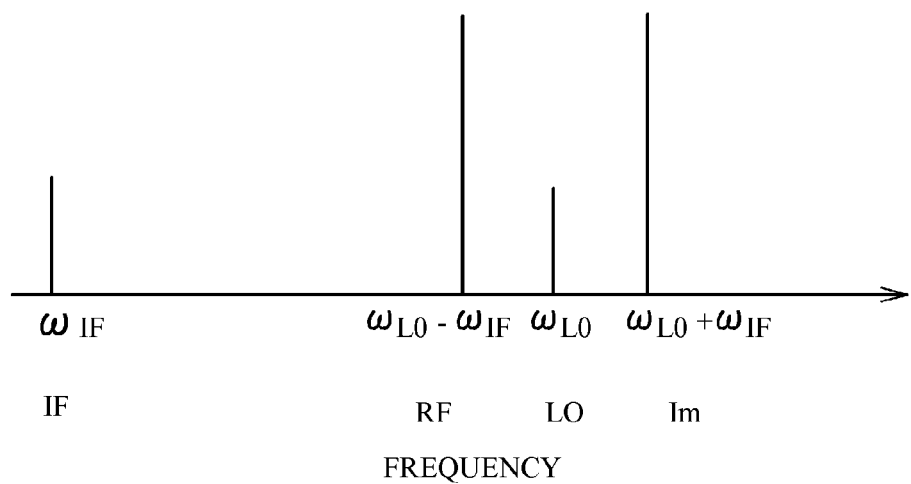
FIG. 9B is a schematic diagram of signal outputs of the mixer.

Table 5 describes exemplary signals in the mixer 20C. FIG. 9B schematically illustrates signal outputs of the mixer 20C.

TABLE 5

| Position | Signal |
| --- | --- |
| FET 44 | LO($\omega_{LO}$), IF($\omega_{IF}$), RF($\omega_{LO} - \omega_{IF}$), Im($\omega_{LO} + \omega_{IF}$) |
| FET 46 | LO($\omega_{LO} + \pi$) |
| N1 | IF($\omega_{IF}$), RF($\omega_{LO} - \omega_{IF}$), Im($\omega_{LO} + \omega_{IF}$) |
| FET 52 | LO($\omega_{LO}$) |
| FET 54 | LO($\omega_{LO} + \pi$), IF($\omega_{IF} + \pi$), RF($\omega_{LO} - \omega_{IF}$), Im($\omega_{LO} + \omega_{IF} + 2\pi$) |
| N3 | IF($\omega_{IF} + \pi$), RF($\omega_{LO} - \omega_{IF}$), Im($\omega_{LO} + \omega_{IF}$) |
| RFOut2 | RF($\omega_{LO} - \omega_{IF}$), Im($\omega_{LO} + \omega_{IF}$) |

The signals of FETs 44 and 46 and node N1 are the same as those described in Table 1. The LO signal LO($\omega_{LO}$) is output from the drain of FET 52. From the drain of FET 54, output are the LO signal LO($\omega_{LO}+\pi$), the IF signal IF($\omega_{IF}+\pi$), the RF signal RF($\omega_{LO}-\omega_{IF}$), and the Im signal Im($\omega_{LO}+\omega_{IF}+2\pi$). The phase $\omega_{LO}+\omega_{IF}+2\pi$ of the Im signal is equal to $\omega_{LO}+\omega_{IF}$. At the node N3, the LO signals are canceled and the IF signal, the RF signal and the Im signal are output.

The output signal of the node N1 and that of the node N3 are combined with each other. The RF signal RF($\omega_{LO}-\omega_{IF}$), and the Im signal Im($\omega_{LO}+\omega_{IF}$) are in phase with each other, and are added. Thus, the RF signal and the Im signal are output as illustrated in FIG. 9B.

Fifth Embodiment

Figure 10:
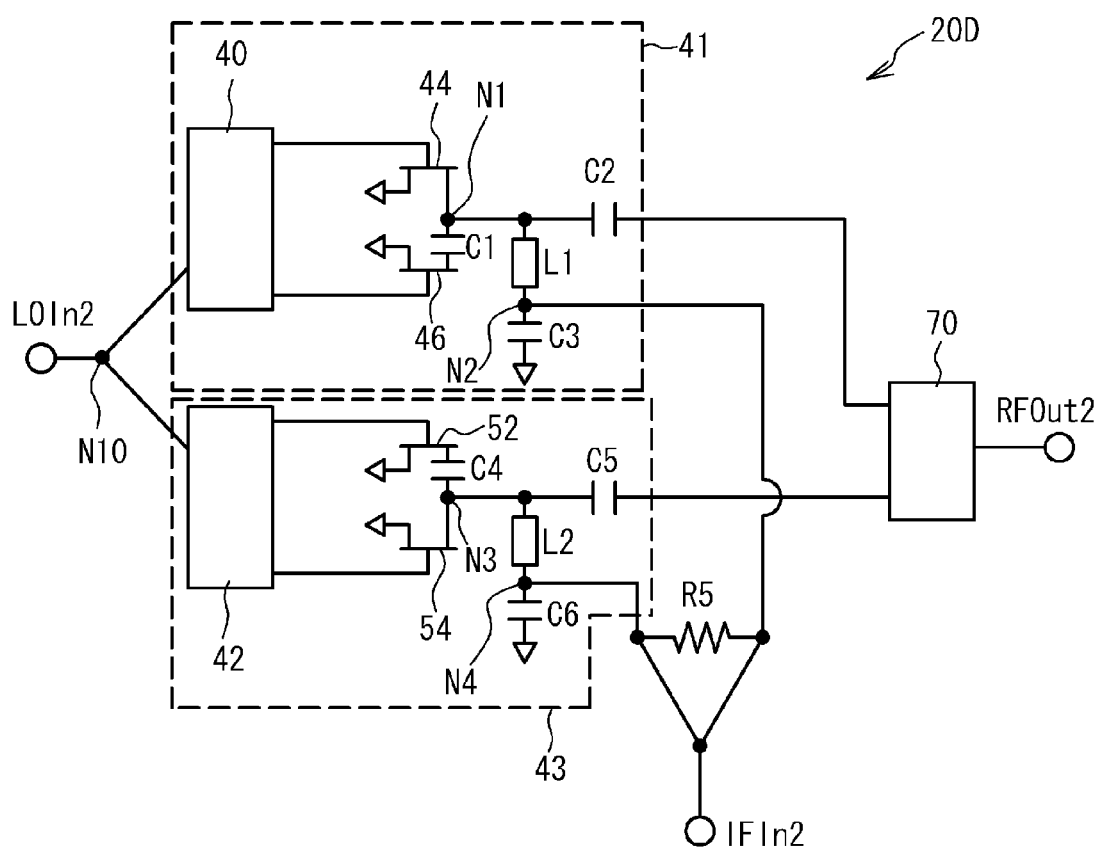
FIG. 10 is a circuit diagram of a mixer in accordance with a firth embodiment.

A fifth embodiment has another exemplary structure in which both the RF signal and the Im signal are output. FIG. 10 is a circuit diagram of a mixer 20D in accordance with the fifth embodiment.

As illustrated in FIG. 10, one end of a resistor R5 is connected between the node N2 and the input terminal IFIn2, and the other end is connected between the node N4 and the input terminal IFIn2. The node N1 is connected to one of two input terminals of a balun 70 through the capacitor C2. The node N3 is connected to the other input terminal of the balun 70 through the capacitor C5. The IF signals are output to the nodes N2 and N4 without making any phase difference therebetween. The balun 70 shifts the phase of the output signal of the node N3 by 180°, and combines it with the output signal of the node N1.

Table 6 describes signal outputs in the mixer 20D.

TABLE 6

| Position | Signal |
| --- | --- |
| FET 44 | LO($\omega_{LO}$), IF($\omega_{IF}$), RF($\omega_{LO} - \omega_{IF}$), Im($\omega_{LO} + \omega_{IF}$) |
| FET 46 | LO($\omega_{LO} + \pi$) |
| N1 | IF($\omega_{IF}$), RF($\omega_{LO} - \omega_{IF}$), Im($\omega_{LO} + \omega_{IF}$) |
| FET 52 | LO($\omega_{LO}$) |
| FET 54 | LO($\omega_{LO} + \pi$), IF($\omega_{IF}$), RF($\omega_{LO} - \omega_{IF} + \pi$), Im($\omega_{LO} + \omega_{IF} + \pi$) |
| N3 | IF($\omega_{IF}$), RF($\omega_{LO} - \omega_{IF} + \pi$), Im($\omega_{LO} + \omega_{IF} + \pi$) |
| RFOut2 | RF($\omega_{LO} - \omega_{IF}$), Im($\omega_{LO} + \omega_{IF}$) |

The output signals of FETs 44, 46 and 52 and node N1 are the same as those described in Table 5. From the drain of FET 54, output are the LO signal LO($\omega_{LO}+\pi$), the IF signal IF($\omega_{IF}$), the RF signal RF($\omega_{LO}-\omega_{IF}+\pi$), and the Im signal Im($\omega_{LO}+\omega_{IF}+\pi$). From the node 3, output are the IF signal IF($\omega_{IF}$), the RF signal RF($\omega_{LO}-\omega_{IF}+\pi$), and the Im signal Im($\omega_{LO}+\omega_{IF}+\pi$). The balun 70 shifts the phase of the output signal of the node N3 by $\pi$. Thus, the RF signal and the Im signal are in phase with each other. The RF signal RF($\omega_{LO}-\omega_{IF}$) and the Im signal Im($\omega_{LO}+\omega_{IF}$) are output from the output terminal RFOut2. The passage of the IF signal is suppressed by the capacitors C2 and C5. The IF signal is suppressed by the balun 70 because the IF signal is out of the band of the balun 70. The fifth embodiment is capable of extracting the RF signal and the Im signal as in the case of the fourth embodiment. According to the first through fifth embodiments, it is possible to output at least one desired signal, which is only the RF signal or the Im signal in addition to the RF signal.

As described above, the capacitors C1 and C4 function as filters that suppress passage of the LO signals. The filters may be formed by elements other than the capacitors.

Figure 11A:
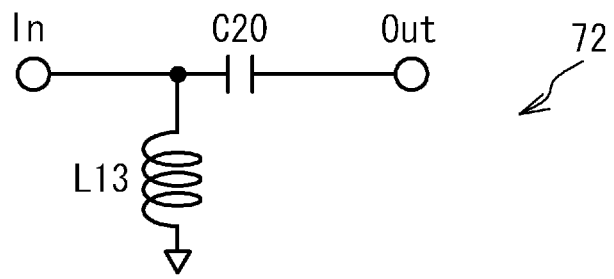
FIG. 11A is a circuit diagram of a high pass filter and FIG. 11B is a schematic diagram of a frequency characteristic of the high pass filter.

FIG. 11A is a circuit diagram of a high pass filter (HPF) 72. As illustrated in FIG. 11A, HPF 72 has a capacitor C20 connected in series between an input terminal In and an output terminal Out. One end of an inductor L13 is connected between the input terminal In and one end of the capacitor C20, and the other end is grounded. The HPF 72 has a frequency characteristic as illustrated in FIG. 2C. Thus, HPF 72 suppresses passage of the IF signal and allows passage of the LO signal.

Figure 11B:
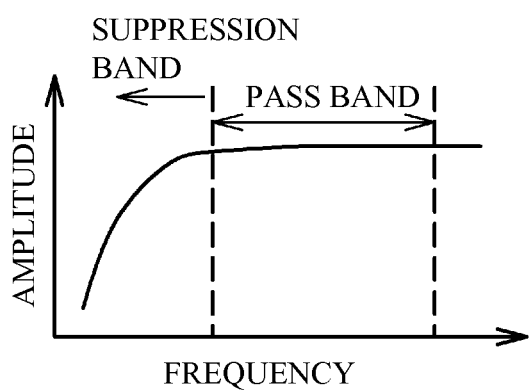

FIG. 11B is a schematic diagram of a frequency characteristic of a filter. The LO signal is included in the pass band, and the IF signal is included in the suppression band. A filter having a filter characteristic as described above may be used.

The passage of the IF signal may be suppressed by a filter that includes at least one of a capacitor and an inductor, while the passage of the LO signal is allowed. Such filters may be connected between the drains of two pairs of FETs (a pair of FETs 44 and 46 and another pair of FETs 52 and 54). The inductors L1 and L2 and the capacitors C3 and C6 may be replaced with filters including either capacitors or inductors. The FETs may be replaced with another type of transistors such as bipolar transistors.

The present invention is not limited to the exemplary embodiments and variations described above but may include other embodiments and variations without departing from the scope of the claimed invention.

What is claimed is:

1. A mixer comprising:
   a node to which an intermediate frequency (IF) signal is input;
   a first transistor that has a first control terminal supplied with a first local signal and a first output terminal connected to the node;
   a second transistor that has a second control terminal supplied with a second local signal having a phase opposite to a phase opposite to a phase of the first local signal and a second output terminal connected to the node;
   a filter that is connected between the second output terminal of the second transistor and the node and suppresses passage of the IF signal,
   wherein the first transistor mixes the first local signal and the IF signal and generates a RF signal, the second transistor does not mix the second local signal and the IF signal and does not generate the RF signal, the RF signal is output from the first output terminal.

2. The mixer according to claim 1, further comprising:
   another filter that is provided the node and suppresses the IF signal.

3. The mixer according to claim 2, wherein at least one of the filter and another filter includes one of a capacitor and an inductor.

4. The mixer according to claim 1, wherein the first and second transistors have high electron mobility transistors.

\* \* \* \* \*